United States Patent
Izawa et al.

(10) Patent No.: US 11,749,531 B2
(45) Date of Patent: Sep. 5, 2023

(54) POLISHING METHOD, AND POLISHING COMPOSITION AND METHOD FOR PRODUCING THE SAME

(71) Applicant: FUJIMI INCORPORATED, Kiyosu (JP)

(72) Inventors: Yoshihiro Izawa, Kiyosu (JP); Kenta Ide, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 1041 days.

(21) Appl. No.: 16/123,632

(22) Filed: Sep. 6, 2018

(65) Prior Publication Data

US 2019/0080927 A1    Mar. 14, 2019

(30) Foreign Application Priority Data

Sep. 11, 2017  (JP) .................. 2017-174193

(51) Int. Cl.
*H01L 21/321* (2006.01)
*C09G 1/16* (2006.01)
*C09G 1/02* (2006.01)
*C09K 3/14* (2006.01)
*H01L 21/3105* (2006.01)

(52) U.S. Cl.
CPC ............ *H01L 21/3212* (2013.01); *C09G 1/02* (2013.01); *C09G 1/16* (2013.01); *C09K 3/1463* (2013.01); *H01L 21/31053* (2013.01)

(58) Field of Classification Search
None
See application file for complete search history.

(56) References Cited

U.S. PATENT DOCUMENTS

| | | | | |
|---|---|---|---|---|
| 6,616,514 B1 * | 9/2003 | Edelbach | ............ | C09K 3/1463 451/36 |
| 7,753,974 B2 * | 7/2010 | Miyabe | .................... | C09G 1/02 438/692 |
| 9,422,456 B2 * | 8/2016 | Grumbine | ......... | H01L 21/30625 |
| 9,484,212 B1 | 11/2016 | Qian et al. | | |
| 2009/0130849 A1 * | 5/2009 | Lee | .................. | H01L 21/02074 438/693 |
| 2009/0223136 A1 * | 9/2009 | Nakajo | .................... | C09G 1/02 51/308 |
| 2013/0200038 A1 | 8/2013 | Li et al. | | |
| 2013/0200039 A1 | 8/2013 | Noller et al. | | |
| 2015/0024596 A1 * | 1/2015 | Minami | ............ | H01L 21/76224 438/693 |
| 2015/0069016 A1 * | 3/2015 | Tamada | ............ | H01L 21/02024 252/79.1 |
| 2015/0079788 A1 * | 3/2015 | Guo | .................. | H01L 21/31053 438/693 |
| 2015/0290760 A1 | 10/2015 | Serikawa et al. | | |
| 2016/0108284 A1 * | 4/2016 | Yoshizaki | ................ | C09G 1/00 252/79.1 |
| 2017/0200617 A1 * | 7/2017 | Yoshikawa | ............. | B24B 37/00 |
| 2017/0243752 A1 * | 8/2017 | Yasui | .................. | H01L 21/3212 |

FOREIGN PATENT DOCUMENTS

| | | | | |
|---|---|---|---|---|
| EP | 2614123 B1 * | 6/2017 | ........... | C09K 3/1409 |
| JP | 2002-114967 A | 4/2002 | | |
| JP | 2013-540850 A | 11/2013 | | |
| JP | 2013-541609 A | 11/2013 | | |
| JP | 2014-225517 A | 12/2014 | | |
| JP | 2017-139443 A | 8/2017 | | |
| KR | 10-2016-0010445 A | 1/2016 | | |
| KR | 10-2016-0135194 A | * 11/2016 | | |
| TW | 201506100 A | 2/2015 | | |

OTHER PUBLICATIONS

Office Action issued in corresponding Japanese Patent Application No. 2017-174193 dated Jun. 1, 2021 with English translation.
Office Action received in corresponding Taiwanese Patent Application No. 107125308 dated Oct. 14, 2021 with English translation.
Office Action issued in corresponding Japanese Patent Application No. 2017-174193 dated Mar. 23, 2021 with English translation.
Office Action received in corresponding Korean patent Application No. 10-2018-0096607 dated Jun. 14, 2023 (6 pages).
U.S. Non-Final Office Action on U.S. Appl. No. 17/902,507 dated Jun. 15, 2023 (8 pages).

* cited by examiner

*Primary Examiner* — Shamim Ahmed
(74) *Attorney, Agent, or Firm* — Foley & Lardner LLP

(57) ABSTRACT

A polishing method according to the present invention, includes polishing a polishing object containing a silicon material by using a polishing composition containing abrasive grains, a tri- or more polyvalent hydroxy compound and a dispersing medium and having pH of less than 6.0.

18 Claims, No Drawings

POLISHING METHOD, AND POLISHING COMPOSITION AND METHOD FOR PRODUCING THE SAME

CROSS-REFERENCE TO RELATED APPLICATION

The present patent application is based on Japanese Patent Application No. 2017-174193, filed on Sep. 11, 2017, the entire disclosure of which is incorporated herein by reference.

BACKGROUND

1. Technical Field

The present invention relates to a polishing method, and a polishing composition and a method for producing the same.

2. Description of Related Arts

In recent years, a technique to polish a semiconductor substrate for planarization, so-called Chemical Mechanical Polishing (CMP) has been used when producing a device, with multilayer wiring on the surface of semiconductor substrates. CMP is a method for planarizing the surface of a polishing object (an object to be polished) such as a semiconductor substrate using a polishing composition (slurry) containing abrasive grains such as silica, alumina or ceria, an anticorrosive, a surfactant, and the like. The polishing object (object to be polished) is silicon, polysilicon, silicon oxide layer (silicon oxide), silicon nitride, a wiring or a plug containing metal, or the like.

As the polishing composition used for such CMP, JP 2002-114967 A for example discloses a polishing solution composition containing one or more compounds selected from the group consisting of amino acids, polyhydroxy-containing compounds and alkylene oxide adducts, as an agent for improving polishing rate selection ratio, which improves the ratio of the polishing rate of an insulating layer to the polishing rate of a stopper layer.

SUMMARY

However, the technique described in JP 2002-114967 A has had a problem in that a reduction in defects on the surface of a polishing object is insufficient.

Therefore, the present invention was made in view of the above circumstances, and an object thereof is to provide a means which can reduce defects on the surface of a polishing object containing a silicon material.

The present inventors conducted intensive studies in view of the above problem. As a result, it was found that the above effect was obtained by a polishing method, including polishing a polishing object containing a silicon material by using a polishing composition containing abrasive grains, a tri- or more polyvalent hydroxy compound and a dispersing medium and having pH of less than 6.0, thereby completing the present invention.

That is, an embodiment to solve the above problem of the present invention is a polishing method, including polishing a polishing object containing a silicon material by using a polishing composition containing abrasive grains, a tri- or more polyvalent hydroxy compound and a dispersing medium and having pH of less than 6.0.

DETAILED DESCRIPTION

The embodiment of the present invention will now be described. It should be noted, however, that the present invention is not limited only to the following embodiment. Unless otherwise specified, operations and measurement of physical properties are carried out under conditions of room temperature (20° C. or higher and 25° C. or lower)/relative humidity 40% RH or higher and 50% RH or lower. In addition, the polishing composition can be simply referred to as "composition" in the present description.

The present invention is a polishing method, the polishing method comprises polishing a polishing object containing a silicon material by using a polishing composition containing abrasive grains, a tri- or more polyvalent hydroxy compound and a dispersing medium and having pH of less than 6.0. According to such polishing method of the present invention, defects on the surface of a polishing object containing a silicon material can be reduced.

The reason why such effect is obtained by the polishing method of the present invention is not necessarily clear, but is thought as follows.

The tri- or more polyvalent hydroxy compound (hereinafter, simply referred to as "polyvalent hydroxy compound") contained in the polishing composition used in the polishing method of the present invention can reduce adhesion of an organic residue derived from pad debris or the like to a polishing object. That is, although there is a problem in that organic residue components adsorb on the surface of a polishing object by hydrophobic interaction and defects (e.g. scratches) increase, it is thought that adhesion of an organic residue to the surface of a polishing object can be reduced by hydrophilization of organic residue components, which are hydrophobic, by a polyvalent hydroxy compound. Therefore, according to the polishing method of the present invention, defects can be reduced on the surface of a polishing object containing a silicon material. Accordingly, according to the present invention, there is provided a means which can reduce defects on the surface of a polishing object containing a silicon material.

It should be noted that the above mechanism is based on a presumption and the correct or the incorrect does not affect the technical scope of the present invention.

The polishing method of the present invention will now be described in more detail.

[Polishing Object (Object to be Polished)]

The polishing object (object to be polished) according to the present invention is not particularly limited as long as a silicon material is contained. Examples of silicon materials include a material having an oxygen atom and a silicon atom, a material having a silicon-silicon bond, a material having a nitrogen atom and a silicon atom, and the like.

Examples of silicon materials having an oxygen atom and a silicon atom include silicon oxide ($SiO_2$), silicon oxide derived from tetraethyl orthosilicate (TEOS), and the like.

Examples of silicon materials having a silicon-silicon bond include polysilicon, amorphous silicon, single-crystalline silicon, n-type doped single-crystalline silicon, p-type doped single-crystalline silicon and a Si-based alloy such as SiGe, and the like.

Silicon materials having a nitrogen atom and a silicon atom include a silicon nitride film, SiCN (silicon carbonitride), and the like.

These silicon materials can be used alone or in combination of two or more thereof.

Among these, when a polishing object contains a silicon material having an oxygen atom and a silicon atom, the effect by the present invention can be more effectively shown. That is, according to a preferred embodiment of the present invention, the silicon material contained in a polishing object has an oxygen atom and a silicon atom. Furthermore, when a polishing object contains a silicon oxide film (layer) derived from tetraethyl orthosilicate (TEOS) as a raw material, the effect by the present invention can be more effectively shown.

It should be noted that the polishing object according to the present invention may contain other materials other than a silicon material. Examples of other materials include silicon carbide (SiC), sapphire ($Al_2O_3$), silicon germanium (SiGe), titanium nitride (TiN), metals such as copper, aluminum, hafnium, cobalt, nickel, titanium, tungsten, tantalum and ruthenium, and the like.

The polishing composition used in the polishing method of the present invention contains abrasive grains, a tri- or more polyvalent hydroxy compound and a dispersing medium, and has pH of less than 6.0. Each component contained in the polishing composition will now be described.

[Abrasive Grains (Abrasives)]

Examples of the abrasive grains used in the polishing composition according to the present invention include particles made of metallic oxides such as silica, alumina, zirconia and titania. The abrasive grains can be used alone or in combination of two or more thereof. The abrasive grains may be a commercial product or a synthetic product.

The abrasive grains are preferably particles of silica, and more preferably colloidal silica. Methods for producing colloidal silica include a sodium silicate method and a sol-gel method, and colloidal silica produced in either production method is favorably used as the abrasive grains of the present invention. However, colloidal silica produced by a sol-gel method, which can produce it with a high purity, is preferred from the viewpoint of a reduction in metallic impurities.

Here, the shape of abrasive grains is not particularly limited, and can be a spherical shape or a non-spherical shape. Specific examples of the non-spherical shape include various shapes such as a polygonal column shape such as a triangle pole or a square pole, a cylindrical shape, a barrel shape in which the central part of a cylinder is more swollen than the edges, a donut shape in which the central part of a disk is open, a plate shape, a so-called cocoon shape which has a constriction in the central part, a so-called associated spherical shape in which a plurality of particles is integrated, a so-called pointed candy ball (confetti; Japanese sugar candy Konpeito) shape having a plurality of bumps on the surface thereof, and a rugby ball shape, and the shape is not particularly limited.

Moreover, the colloidal silica can be surface-modified using a silane coupling agent or the like.

As the method for surface-modifying the surface of abrasive grains using a silane coupling agent, there is a immobilization method as described below. For example, the surface-modification can be performed by a method described in "Sulfonic acid-functionalized silica through of thiol groups," Chem. Commun. 246-247 (2003). Particularly, a silane coupling agent having a thiol group such as 3-mercaptopropyl trimethoxysilane is allowed to couple with colloidal silica, followed by oxidizing the thiol group with hydrogen peroxide to obtain colloidal silica having sulfonic acid immobilized on the surface thereof.

Alternatively, for example, the surface-modification can be performed by a method described in "Novel Silane Coupling Agents Containing a Photolabile 2-Nitrobenzyl Ester for Introduction of a Carboxy Group on the Surface of Silica Gel," Chemistry Letters, 3, 228-229 (2000). Particularly, a silane coupling agent containing a photoreactive 2-nitrobenzyl ester is allowed to couple with colloidal silica, followed by light irradiation to obtain colloidal silica having a carboxylic acid immobilized on the surface thereof.

The above colloidal silica is colloidal silica having an anionic group (anion-modified colloidal silica); however, colloidal silica having a cationic group (cation-modified colloidal silica) can be also used. As the colloidal silica having a cationic group, there is colloidal silica having an amino group immobilized on the surface thereof. As a method for producing such colloidal silica having a cationic group, there is a method as described in JP 2005-162533 A, in which a silane coupling agent having an amino group such as aminoethyltrimethoxysilane, aminopropyltrimethoxysilane, aminoethyltriethoxysilane, aminopropyltriethoxysilane, aminopropyldimethylethoxysilane, aminopropylmethyldiethoxysilane or aminobutyltriethoxysilane is immobilized on the surface of abrasive grains. Colloidal silica having an amino group immobilized on the surface thereof can be obtained in this manner.

The size of abrasive grains is not particularly limited. When the abrasive grain has a spherical shape, for example, the average primary particle diameter of abrasive grains is preferably 5 nm or more, more preferably 10 nm or more, further preferably 20 nm or more, and particularly preferably 25 nm or more. As the average primary particle diameter of abrasive grains increases, the polishing removal rate (polishing speed) for a polishing object by the polishing composition is improved. In addition, the average primary particle diameter of abrasive grains is preferably 200 nm or less, more preferably 100 nm or less, further preferably 50 nm or less, and particularly preferably 40 nm or less. As the average primary particle diameter of abrasive grains decreases, it is easy to obtain a surface with fewer defects by polishing using the polishing composition. That is, the average primary particle diameter of abrasive grains is preferably 5 nm or more and 200 nm or less, more preferably 10 nm or more and 100 nm or less, further preferably 20 nm or more and 50 nm or less, and particularly preferably 25 nm or more and 40 nm or less. The average primary particle diameter of abrasive grains can be calculated, for example, based on the specific surface area (SA) of abrasive grains calculated by the BET method on the assumption that the shape of abrasive grains is a true sphere. In the present description, a value measured by a method described in Examples below is adopted as the average primary particle diameter of abrasive grains.

In addition, the average secondary particle diameter of abrasive grains is preferably 25 nm or more, more preferably 35 nm or more, further preferably 50 nm or more, and particularly preferably 55 nm or more. As the average secondary particle diameter of abrasive grains increases, friction during polishing decreases and polishing can be stably performed. In addition, the average secondary particle diameter of abrasive grains is preferably 1 μm or less, more preferably 500 nm or less, further preferably 100 nm or less, and particularly preferably 80 nm or less. As the average secondary particle diameter of abrasive grains decreases, the surface area of abrasive grain per unit mass increases, frequency of contact with a polishing object is improved, and polishing efficiency is improved. That is, the average secondary particle diameter of abrasive grains is preferably 25 nm or more and 1 μm or less, more preferably 35 nm or more and 500 nm or less, further preferably 55 nm or more and 100 nm or less, and particularly preferably 55 nm or more and 80 nm or less. In the present description, a value measured by a method described in Examples below is adopted as the average secondary particle diameter of abrasive grains.

The average association degree of abrasive grains is preferably less than 5.0, more preferably 3.0 or less, further preferably 2.5 or less, and particularly preferably 2.3 or less. As the average association degree of abrasive grains decreases, defects can be further reduced. In addition, the average association degree of abrasive grains is preferably 1.0 or more, more preferably 1.05 or more, further preferably 1.5 or more, and particularly preferably 1.8 or more. This average association degree can be obtained by dividing a value of the average secondary particle diameter of abrasive grains by a value of the average primary particle diameter of abrasive grains. As the average association degree of abrasive grains increases, there is an advantageous effect that the polishing removal rate for a polishing object by the polishing composition is improved.

The upper limit of the aspect ratio of abrasive grains in the polishing composition is not particularly limited, and is preferably less than 2.0, more preferably 1.8 or less, and further preferably 1.5 or less. In such range, defects on the surface of a polishing object can be further reduced. The aspect ratio is the average of values obtained by dividing a length on the long side of a rectangle, which is the smallest rectangle circumscribing an abrasive grain particle image by a scanning electron microscope, by a length on the short side of the same rectangle. The aspect ratio can be obtained using a common image analyzing software. The lower limit of the aspect ratio of abrasive grains in the polishing composition is not particularly limited, and is preferably 1.0 or more.

In the particle size distribution of abrasive grains obtained by a laser diffraction scattering method, the lower limit of D90/D10, which is the ratio of the particle diameter when the particle weight accumulated from finer particles reaches 90% of the total particle weight (D90), and the particle diameter when the particle weight reaches 10% of the total particle weight of all particles (D10), is not particularly limited, and is preferably 1.1 or more, more preferably 1.2 or more, and further preferably 1.3 or more. In addition, in the particle size distribution of abrasive grains in the polishing composition obtained by a laser diffraction scattering method, the upper limit of D90/D10, which is the ratio of the particle diameter when the particle weight accumulated from finer particles reaches 90% of the total particle weight (D90), and the particle diameter when the particle weight reaches 10% of the total particle weight of all particles (D10), is not particularly limited, and is preferably 2.04 or less. In such range, defects on the surface of a polishing object can be further reduced.

The sizes of abrasive grains (average primary particle diameter, average secondary particle diameter, aspect ratio, D90/D10, etc.) can be appropriately controlled, for example, by selecting a method for producing abrasive grains.

The absolute value of zeta potential of the above abrasive grains in the polishing composition is preferably 10 mV or more. In such range, the electrostatic repulsion of abrasive grains each other becomes strong and thus the dispersion stability of abrasive grains is improved. The zeta potential of abrasive grains can be measured, for example, by a commercial zeta potential measuring instrument.

The content of the abrasive grains is not particularly limited. The polishing composition according to the present invention can efficiently polish the surface of the polishing object, even when a small amount (low concentration) of abrasive grain is used, since the abrasive grains efficiently exist on the surface of a polishing object. Particularly, the content (concentration) of the abrasive grains is preferably 0.002% by mass or more, more preferably 0.2% by mass or more, and further preferably 1% by mass or more, relative to the total amount of the polishing composition. In addition, the upper limit of the content of the abrasive grains is preferably less than 8% by mass, more preferably 6% by mass or less, and further preferably 4% by mass or less, relative to the total amount of the polishing composition. That is, the content of the abrasive grains is preferably 0.002% by mass or more and less than 8% by mass, more preferably 0.2% by mass or more and 6% by mass or less, and further preferably 1% by mass or more and 4% by mass or less, relative to the total amount of the polishing composition. In such range, costs can be reduced, and simultaneously both an improvement in polishing removal rate and a reduction in defects can be obtained in a balanced manner. It should be noted that when the polishing composition contains two or more abrasive grains, the content of the abrasive grains is intended to be the total amount thereof.

[Tri- or More Polyvalent Hydroxy Compound]

The polishing composition used in the present invention contains a tri- or more polyvalent hydroxy compound. The polishing composition contains the polyvalent hydroxy compound, thereby reducing defects on the surface of a polishing object.

The polyvalent hydroxy compound used in the present invention is not particularly limited as long as the polyvalent hydroxy compound is a compound having three or more alcoholic hydroxy groups or phenolic hydroxy groups in a molecule.

Specific examples of tri- or more polyvalent hydroxy compounds include aliphatic polyvalent hydroxy compounds such as sugar alcohols such as polyester polyol, polyglycidol, propane-1,2,3-triol, poly(propane-1,2,3-triol), trimethylolethane, trimethylolpropane, 1,3,5-pentatriol, pentaerythritol, dipentaerythritol, sorbitan, adonitol, maltitol, threitol, erythritol, xylitol, arabinitol, ribitol, (2R,3R,4S)-pentane-1,2,3,4,5-pentole, (2R,3S,4S,5S)-hexane-1,2,3,4,5,6-hexol, mannitol, lactitol, galactitol, dulcitol, talitol, iditol, allitol, perseitol, volemitol, D-erythro-L-galaoctitol, D-erythro-L-talooctitol, erythromannooctitol, D-threo-L-galaoctitol, D-arabo-D-mannononitol, D-gluco-D-galadecitol, bornesitol, conduritol, inositol, ononitol, pinitol, pinpolitol, quebrachitol, valienol and viscumitol; saccharides such as glucose, fructose, mannose, indose, sorbose, gulose, talose, tagatose, galactose, (2R,3R,4S,5S,6R)-2-[(2S,3S,4S,5R)-3,4-dihydroxy-2,5-bis(hydroxymethyl)oxolan-2-yl]oxy-6-(hydroxymethyl)oxane-3,4,5-triol, (2S,3R,4R,5S,6R)-6-(hydroxymethyl)-5-((2S,3R,4S,5R,6R)-3,4,5-trihydroxy-6-(hydroxymethyl)tetrahydro-2H-pyran-2-yloxy)tetrahydro-2H-pyran-2,3,4-triol, allose, apiose, psicose, altrose, arabinose, ribulose, ribose, deoxyribose, fucose, xylose, xylulose, lyxose, idose, threose, erythrulose, erythrose, rhamnose, cellobiose, kojibiose, nigerose, sophorose, maltose, isomaltose, trehalose, isotrehalose, laminaribiose, gentiobiose, palatinose, coriose, sedoheptulose, glycyrrhizin, stevioside, mogroside, sucrose, raffinose, gentianose, melezitose, maltotriose, isomaltotriose, sucralose, dextrin, cyclodextrin, glucosamine, mannosamine, galactosamine, N-acetylglucosamine, N-acetylmannosamine and N-acetylgalactosamine; saccharic acids such as glucuronic acid and galacturonic acid; polyvalent hydroxy lactones such as ascorbic acid, glucuronolactone and gluconolactone; amino group-containing polyvalent hydroxy compounds such as monellin and curculin; water-soluble polymers such as starch, glycogen, amylose, amylopectin, carboxymethyl starch, methylhydroxypropyl starch, methylcellulose, ethylcellulose, methylhydroxypropylcellulose, hydroxyethylcellulose, sodium cellulose sulfate, hydroxypropylcellulose, carboxymethylcellulose, cellulose, sodium alginate, propylene glycol alginic acid ester and polyvinyl alcohol; and the like.

In addition, aromatic polyvalent hydroxy compounds such as pyrogallol, 1,2,4-trihydroxybenzene, phloroglucinol, benzenetetrol, benzenehexol, 1,4,5-trihydroxynaphthalene, 1,2,7-trihydroxynaphthalene, 1,3,8-trihydroxynaphthalene, 1,2,3,4-tetrahydroxynaphthalene and 1,3,6,8-tetrahydroxynaphthalene can be also used.

These polyvalent hydroxy compounds can be used alone or in combination of two or more thereof.

Among the above polyvalent hydroxy compounds, sugar alcohols are further preferred from the viewpoint that the effect of the present invention can be more efficiently obtained.

Moreover, the sugar alcohol is preferably at least one selected from the group consisting of (2R,3R,4S)-pentane-1,2,3,4,5-pentole, (2R,3S,4S,5S)-hexane-1,2,3,4,5,6-hexol, propane-1,2,3-triol, xylitol, arabinitol, erythritol, threitol, ribitol, galactitol, mannitol, maltitol, lactitol and inositol.

The lower limit of the molecular weight of polyvalent hydroxy compound is not particularly limited, and is preferably 90 or more and more preferably 150 or more from the viewpoint that the effect of reducing defects is more effectively obtained. In addition, the upper limit of the molecular weight of polyvalent hydroxy compound is not particularly limited, and is preferably 10000 or less, more preferably 1000 or less and further preferably 500 or less from the viewpoint of solubility.

It should be noted that "molecular weight" indicates the sum total of atomic weight of elements forming a molecule. However, when a molecule contains two or more repeating units, the molecular weight of the molecule indicates weight average molecular weight (in terms of polyethylene glycol). The weight average molecular weight can be measured, for example, using gel permeation chromatography (GPC).

The concentration (content) of the polyvalent hydroxy compound in the polishing composition is preferably 1 mM (mmol/L) or more and 5 mM (mmol/L) or less. When the concentration is in this range, defects can be further reduced. The lower limit of the concentration of the polyvalent hydroxy compound in the polishing composition is more preferably 2 mM or more and further preferably 2.5 mM or more. In addition, the upper limit of the concentration of the polyvalent hydroxy compound in the polishing composition is more preferably 4 mM or less and further preferably 3.5 mM or less.

[Dispersing Medium]

The polishing composition according to the present invention contains a dispersing medium to disperse each component. Examples of dispersing media include water; alcohols such as methanol, ethanol and ethylene glycol; ketones such as acetone, and mixtures thereof, and the like. Among these, water is preferred as the dispersing medium. That is, according to a preferred embodiment of the present invention, the dispersing medium contains water. According to a more preferred embodiment of the present invention, the dispersing medium is substantially composed of water. It should be noted that the above "substantially" is intended to be able to contain a dispersing medium other than water as long as the objective effect of the present invention can be achieved, and more particularly the dispersing medium contains preferably 90% by mass or more and 100% by mass or less of water and 0% by mass or more and 10% by mass or less of dispersing medium other than water, and more preferably 99% by mass or more and 100% by mass or less of water and 0% by mass or more and 1% by mass or less of dispersing medium other than water. According to the most preferred embodiment of the present invention, the dispersing medium is water. From the viewpoint of suppressing inhibition of actions of other components, water which contains as few impurities as possible is preferable. Particularly, pure water or ultrapure water obtained by removing impurity ions using an ion exchange resin and then removing contaminants through a filter, or distilled water is preferable.

[pH]

The pH of the polishing composition according to the present invention is less than 6.0. When the pH is 6.0 or more, defects on the surface of a polishing object increase. The pH is preferably 5.8 or less, more preferably 5.5 or less, and particularly preferably less than 5.5. In addition, the lower limit value of pH is not particularly limited, and is preferably 1.0 or more, and more preferably 2.0 or more. That is, the pH of the polishing composition according to the present invention is preferably 1.0 or more and 5.8 or less, more preferably 2.0 or more and 5.5 or less, and particularly preferably 2.0 or more and less than 5.5.

It should be noted that unless otherwise specified, "pH" means "pH at 25° C." in the present description. In addition, a value measured at 25° C. by a pH meter (model number: LAQUA manufactured by HORIBA, Ltd.) is adopted as pH in the present description.

The above pH can be adjusted by adding a suitable amount of pH adjusting agent. That is, the polishing composition may further contain a pH adjusting agent. Here, the pH adjusting agent used as needed to adjust the pH of the polishing composition to a desired value can be either an acid or an alkali, and also either an inorganic compound or an organic compound. Specific examples of acids include inorganic acids such as sulfuric acid, nitric acid, boric acid, carbonic acid, hypophosphorous acid, phosphorous acid and phosphoric acid; organic acids such as carboxylic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid and lactic acid, organic sulfuric acids such as methanesulfonic acid, ethanesulfonic acid and isethionic acid, and organic phosphorus acids such as phytic acid and hydroxyethylidenediphosphonic acid, and the like.

Specific examples of alkalis include alkali metal hydroxides such as potassium hydroxide, amines such as ammonia, ethylenediamine and piperazine, and quaternary ammonium salts such as tetramethylammonium and tetraethylammonium. These pH adjusting agents can be used alone or in combination of two or more thereof.

[Other Components]

The polishing composition used in the polishing method of the present invention may further contain other components such as an oxidizing agent, an amino acid, a chelating agent, a metal anticorrosive, an antiseptic agent, an antifungal agent, a water-soluble polymer, and an organic solvent to dissolve organic materials having poor solbility, if necessary. As preferred other components, an oxidizing agent, an amino acid and a chelating agent, will now be described.

(Oxidizing Agent)

The oxidizing agents which can be added to the polishing composition have the action of oxidizing the surface of a polishing object and can improve the polishing removal rate for a polishing object by the polishing composition.

The oxidizing agents which can be used include hydrogen peroxide, sodium peroxide, barium peroxide, ozone water, silver (II) salt, iron (III) salt, permanganic acid, chromic acid, dichromic acid, peroxydisulfuric acid, peroxophosphoric acid, peroxysulfuric acid, peroxyboric acid, performic acid, peracetic acid, peroxybenzoic acid, peroxyphthalic acid, hypochlorous acid, hypobromous acid, hypoiodous acid, chloric acid, chlorous acid, perchloric acid, bromic acid, iodic acid, periodic acid, peroxysulfuric acid, dichloroisocyanuric acid and salts thereof, and the like. These oxidizing agents can be used alone or in combination of two or more thereof.

The oxidizing agent content in the polishing composition is preferably 0.1 g/L or more, more preferably 1 g/L or more, and further preferably 3 g/L or more. As the oxidizing agent content increases, the polishing removal rate for a polishing object by the polishing composition is further improved.

In addition, the content of the oxidizing agent in the polishing composition is preferably 200 g/L or less, more preferably 100 g/L or less, and further preferably 40 g/L or less. As the content of the oxidizing agent decreases, material costs for the polishing composition can be reduced, and moreover the burden of treatment of the polishing composition after used for polishing, i.e. wastes treatment can be reduced. In addition, an excessive oxidization of the surface of a polishing object due to an oxidizing agent can be reduced or suppressed.

(Amino Acid)

Specific examples of amino acids include glycine, α-alanine, β-alanine, N-methylglycine, N,N-dimethylglycine, 2-aminobutyric acid, norvaline, valine, leucine, norleucine, isoleucine, phenylalanine, proline, sarcosine, ornithine, lysine, taurine, serine, threonine, homoserine, tyrosine, bicine, tricine, 3,5-diiode-tyrosine, β-(3,4-dihydroxyphenyl)-alanine, thyroxine, 4-hydroxy-proline, cysteine, methionine, ethionine, lanthionine, cystathionine, cystine, cysteic acid, aspartic acid, glutamic acid, S-(carboxymethyl)-cysteine, 4-aminobutyric acid, asparagine, glutamine, azaserine, arginine, canavanine, citrulline, δ-hydroxy-lysine, creatine, histidine, 1-methyl-histidine, 3-methyl-histidine and tryptophan and the like.

(Chelating Agent)

Specific examples of chelating agents include nitrilotriacetic acid, diethylenetriaminepentaacetic acid, ethylenediaminetetraacetic acid, N,N,N-trimethylenephosphonic acid, ethylenediamine-N,N,N',N'-tetramethylenesulfonic acid, trans-cyclohexanediaminetetraacetic acid, 1,2-diaminopropanetetraacetic acid, glycoletherdiaminetetraacetic acid, ethylenediamine orthohydroxyphenylacetic acid, ethylenediaminedisuccinic acid (S,S), N-(2-carboxylate ethyl)-L-aspartic acid, β-alaninediacetic acid, 2-phosphonobutane-1,2,4-tricarboxylic acid, 1-hydroxyethylidene-1,1-diphosphonic acid, N,N'-bis(2-hydroxybenzyl) ethylenediamine-N,N'-diacetic acid, 1,2-dihydroxybenzene-4,6-disulfonic acid, and the like.

When the polishing composition contains a chelating agent and/or an amino acid, each of the content (concentration) of the chelating agent and the content (concentration) of the amino acid is not particularly limited. For example, the lower limit of the content (concentration) of each of the chelating agent and the amino acid is not particularly limited because the effect is shown even when a small amount thereof is used, and is preferably 0.001 g/L or more, more preferably 0.01 g/L or more and further preferably 1 g/L or more. In addition, the upper limit of the content (concentration) of each of the chelating agent and amino acid is preferably 20 g/L or less, more preferably 15 g/L or less, and further preferably 10 g/L or less.

As a polishing machine used in the polishing method of the present invention, there is a common polishing machine which is equipped with a holder for holding a substrate or the like having a polishing object and a motor whose rotation number can be changed, and has a polishing table (platen) on which a polishing pad (polishing cloth) can be attached.

As the polishing pad, a common unwoven fabric, polyurethane, porous fluorine resin or the like can be used without particular limitation. The polishing pad is preferably groove-processed for retaining a polishing solution.

The polishing conditions are also not particularly limited; for example, the rotation speed of a polishing table (platen) is preferably 10 rpm (0.17 s$^{-1}$; 60 rpm=1 s$^{-1}$, the same applies hereinafter) or more and 500 rpm (8.3 s$^{-1}$) or less, and pressure (polishing pressure) applied to a polishing object is preferably 0.5 psi (3.4 kPa; 1 psi=6894.76 Pa, the same applies hereinafter) or more and 10 psi (68.9 kPa) or less. A method for supplying the polishing composition to a polishing pad is also not particularly limited; for example, a continuous supplying method using a pump or the like is used. The supplying amount thereof is not limited, and it is preferred that the polishing composition according to the present invention constantly cover the surface of the polishing pad.

After completion of polishing, a substrate is washed in running water and dried by flicking water droplets on the substrate with a spin dryer or the like to obtain a polished object.

[Polishing Composition]

As described above, the polishing composition used in the polishing method of the present invention contains abrasive grains, a tri- or more polyvalent hydroxy compound and a dispersing medium, and has pH of less than 6.0. That is, the present invention provides a polishing composition for polishing a polishing object containing a silicon material, the polishing composition comprises abrasive grains, a tri- or more polyvalent hydroxy compound and a dispersing medium, and has pH of less than 6.0.

The polishing composition according to the present invention can be a one-component type (a single-agent type) or a multicomponent type (a multi-agent type) including a two-component type, which is used by mixing all or part of the polishing composition at an arbitrary mixing ratio. In addition, when using a polishing machine having a plurality of polishing composition supplying routes, two or more polishing compositions which are adjusted in advance so that the polishing compositions will be mixed on the polishing machine can be used.

In addition, the polishing composition according to the present invention can be in the form of undiluted solution (stock solution), and can be prepared by diluting the undiluted solution (stock solution) of the polishing composition with water. When the polishing composition is a two-component type, the order of mixing and dilution is arbitrary. For example, there are a case where one component (polishing composition) is diluted with water and then two components are mixed, a case where dilution with water is carried out at the same time as mixing of two components (polishing composition), and a case where a mixed two components (a mixed polishing composition) is diluted with water, and the like.

[Method for Producing Polishing Composition]

The method for producing the polishing composition of the present invention preferably contains mixing abrasive grains, a tri- or more polyvalent hydroxy compound and other component which is arbitrarily used in a dispersing medium. That is, the present invention provides a method for producing a polishing composition, the method comprising mixing abrasive grains, a tri- or more polyvalent hydroxy compound and a dispersing medium.

The temperature when mixing components is not particularly limited, and is preferably 10 to 40° C., and heating can be carried out to increase the dissolution rate. In addition, the mixing time is not particularly limited.

The embodiments of the present invention have been described in detail. However, they are presented for illustration and exemplary purposes and not limitative, and it is clear that the scope of the present invention should be understood by terms of the attached claims.

The present invention encompasses the following aspects and modes:

1. a polishing method, comprising polishing a polishing object containing a silicon material by using a polishing composition containing abrasive grains, a tri- or more polyvalent hydroxy compound and a dispersing medium and having pH of less than 6.0;
2. the polishing method according to 1 above, wherein the tri- or more polyvalent hydroxy compound has the molecular weight of 90 or more;
3. the polishing method according to 1 or 2 above, wherein the tri- or more polyvalent hydroxy compound is a sugar alcohol;
4. the polishing method according to any of 1 to 3 above, wherein the pH is 2.0 or more and 5.5 or less;
5. the polishing method according to any of 1 to 4 above, wherein the silicon material has an oxygen atom and a silicon atom;
6. a polishing composition for polishing a polishing object containing a silicon material, comprising: abrasive grains, a tri- or more polyvalent hydroxy compound and a dispersing medium; and having pH of less than 6.0; and
7. a method for producing the polishing composition according to 6 above, the method comprising mixing the abrasive grains, the tri- or more polyvalent hydroxy compound and the dispersing medium.

EXAMPLES

The present invention will be described in more detail by way of Examples and Comparative Examples below. It should be noted, however, that the technical scope of the present invention is not limited only to Examples below. Unless otherwise specified, "%" and "parts" mean "% by mass" and "parts by mass" respectively. In addition, unless otherwise specified, operations were carried out under conditions of room temperature (25° C.)/relative humidity 40% RH or higher and 50% RH or lower in Examples below.

The average primary particle diameter (nm) and average secondary particle diameter (nm) of silica (abrasive grains) were measured by the following method.

[Average Particle Diameter (nm) of Silica (Abrasive Grains)]

The average primary particle diameter (nm) of silica (abrasive grains) was calculated based on the average value of specific surface area (SA) of silica particles calculated from values obtained by continuously measuring 0.2 g of silica sample 3 to 5 times by the BET method on the assumption that the shape of silica particles is a true sphere. Additionally, the value of association degree can be also calculated from these values (average secondary particle diameter/average primary particle diameter).

The average secondary particle diameter (nm) of silica (abrasive grains) was obtained by measuring a silica sample using a dynamic light-scattering type particle size distribution analyzer (UPA-UT151 manufactured by NIKKISO CO., LTD.) First, abrasive grains were dispersed in pure water to prepare a dispersion liquid having a loading index (laser scattering intensity) of 0.01. Next, the value of volume average particle diameter Mv in the UT mode was continuously measured 3 to 5 times using this dispersion liquid, and the average value of the obtained values was used as the average secondary particle diameter.

[Polyvalent Hydroxy Compound]

Polyvalent hydroxy compounds used in Examples and Comparative Examples are as follows.

Compound a: (2R,3R,4S)-pentane-1,2,3,4,5-pentode,
Compound b: propane-1,2,3-triol,
Compound c: (2R,3S,4S,5S)-hexane-1,2,3,4,5,6-hexol,
Compound d: (2S,3R,4R,5S,6R)-6-(hydroxymethyl)-5-((2S,3R,4S,5R,6R)-3, 4,5-trihydroxy-6-(hydroxymethyl)tetrahydro-2H-pyran-2-y loxy)tetrahydro-2H-pyran-2,3,4-triol, and
Compound e: (2R,3R,4S,5S,6R)-2-[(2S,3S,4S,5R)-3,4-dihydroxy-2,5-bis(hydroxymethyl)oxolan-2-yl]oxy-6-(hydroxymethyl)oxane-3,4, 5-triol.

Example 1

As the abrasive grains, abrasive grains A were prepared. The abrasive grains A are unmodified colloidal silica having an average primary particle diameter of 32 nm and an average secondary particle diameter of 63 nm.

The above abrasive grains A were stirred and dispersed in a dispersing medium (pure water) so that the concentration in a composition would be 1.5% by mass, and Compound a, as a polyvalent hydroxy compound, was added so that the concentration in the composition would be 3 mM, and moreover acetic acid was added as a pH adjusting agent so that the pH of the polishing composition would be 2.0 to prepare the polishing composition (mixing temperature: about 25° C., mixing time: about 10 minutes). The pH of the polishing composition (solution temperature: 25° C.) was measured by a pH meter (model number: LAQUA manufactured by HORIBA, Ltd.).

Examples 2 to 5, Examples 8 to 9

Each polishing composition was prepare in the same manner as in Example 1 except that the type of polyvalent hydroxy compound and/or the pH of the polishing composition were/was changed as shown in Table 1 given below.

Example 6

As the abrasive grains, abrasive grains B were prepared. The abrasive grains B are anion-modified colloidal silica having an average primary particle diameter of 35 nm and an average secondary particle diameter of 70 nm.

The above abrasive grains B were stirred and dispersed in a dispersing medium (pure water) so that the concentration in a composition would be 1.5% by mass, and Compound a, as a polyvalent hydroxy compound, was added so that the concentration in the composition would be 3 mM, and moreover acetic acid was added as a pH adjusting agent so that the pH of the polishing composition would be 4.0 to prepare the polishing composition (mixing temperature: about 25° C., mixing time: about 10 minutes).

Example 7

A polishing composition was prepared in the same manner as in Example 6 except that abrasive grains C, cation-modified colloidal silica (average primary particle diameter: 32 nm, average secondary particle diameter: 63 nm) were used as the abrasive grains.

Comparative Examples 1 to 8

A polishing composition was prepared in the same manner as in Example 1 except that the type and concentration of polyvalent hydroxy compound or the pH of the polishing composition was changed as shown in Table 1 given below. In Comparative Examples 2 and 3, ammonia was used as a pH adjusting agent.

<Evaluation>

Using each polishing composition obtained above, a polishing object (TEOS substrate) was polished under the polishing conditions described below.

(Polishing Conditions)

Polishing machine: small desktop polishing machine (EJ380IN manufactured by Engis Japan Corporation), Polishing pad: hard polyurethane pad (IC1000 manufactured by Nitta Haas Incorporated), Platen (table) rotation speed: 60 [rpm],
Head (carrier) rotation speed: 60 [rpm],
Polishing pressure: 3.0 [psi],
Supply flow rate of polishing composition (slurry): 100 [mL/min], and
Polishing time: 1 [min].

[Defect Suppression Ability]

Using each polishing composition obtained above, defect suppression ability was evaluated in accordance with a method described below. Particularly, regarding the surface of a polished object after polishing, defects having a size of 0.13 µm or more were detected on the whole surface of a wafer (except a region within 2 mm from the peripheral end) using "SURFSCAN (registered trademark) SP2," a defect detection tester (a wafer surface defect tester) manufactured by KLA-TENCOR Corporation. By observing all the detected defects using Review-SEM (RS-6000 manufactured by Hitachi High-Technologies Corporation), the number of detected defects was counted. In addition, the obtained number of defects was evaluated in accordance with criteria described below. The symbols of ⊙, ○ and Δ indicate that the polishing composition is practically usable.

(Criteria)

⊙: less than 10 defects having a size of 0.13 µm or more,
○: 10 or more and less than 15 defects having a size of 0.13 µm or more,
γ: 15 or more and less than 25 defects having a size of 0.13 µm or more, and
×: 25 or more defects having a size of 0.13 µm or more.

[Dispersion Stability]

The dispersion stability of abrasive grains in a polishing composition was evaluated as described below. That is, a polishing composition was kept in an 80° C. thermo-hygrostat for 15 days or 30 days, and the dispersion stability of abrasive grains was then visually observed. The evaluation results are shown in Table 1 given below. In Table 1 given below, the symbol of ° indicates that aggregation of abrasive grains did not occur even when kept at 80° C. for 30 days, and the symbol of and Δ indicates that aggregation of abrasive grains did not occur during storage at 80° C. for 15 days but aggregation of abrasive grains occurred during storage for 30 days.

The components and evaluation results of polishing compositions in Examples and Comparative Examples are shown in Table 1 given below.

TABLE 1

| | Polyvalent hydroxy compound | | | | Evaluation | | |
| | | | | | Defect | | Dispersion stability |
| | Type | Molecular weight | Concentration (mM) | pH of composition | Number (count) | Evaluation result | Evaluation result |
|---|---|---|---|---|---|---|---|
| Example 1 | Compound a | 152.15 | 3 | 2.0 | 9 | ⊙ | Δ |
| Example 2 | Compound a | 152.15 | 3 | 4.0 | 8 | ⊙ | Δ |
| Example 3 | Compound a | 152.15 | 3 | 5.5 | 12 | ○ | Δ |
| Example 4 | Compound b | 92.09 | 3 | 4.0 | 14 | ○ | Δ |
| Example 5 | Compound c | 182.17 | 3 | 4.0 | 9 | ⊙ | Δ |
| Example 6 | Compound a | 152.15 | 3 | 4.0 | 9 | ⊙ | ○ |
| Example 7 | Compound a | 152.15 | 3 | 4.0 | 6 | ⊙ | ○ |
| Example 8 | Compound d | 342.30 | 3 | 4.0 | 14 | ○ | Δ |
| Example 9 | Compound e | 342.30 | 3 | 4.0 | 13 | ○ | Δ |
| Comparative example 1 | — | — | — | 6.0 | 59 | X | ○ |
| Comparative example 2 | — | — | — | 8.0 | 87 | X | ○ |
| Comparative example 3 | — | — | — | 10.0 | 69 | X | ○ |
| Comparative example 4 | — | — | — | 4.0 | 53 | X | Δ |
| Comparative example 5 | Compound e | 342.30 | 3 | 6.0 | 41 | X | Δ |
| Comparative example 6 | Isopropanol | 60.10 | 3 | 4.0 | 64 | X | Δ |
| Comparative example 7 | Ethanol | 46.07 | 3 | 4.0 | 56 | X | Δ |
| Comparative example 8 | 1,2-ethanediol | 62.07 | 3 | 4.0 | 59 | X | Δ |

As can be seen from Table 1 above, the polishing methods in Examples can reduce defects on the surface of a polishing object as compared to the polishing methods in Comparative Examples.

This application is based on Japanese patent application No. 2017-174193 filed on Sep. 11, 2017, the disclosed contents of which are incorporated herein by reference in its entirety.

What is claimed is:

1. A polishing method, comprising polishing a polishing object containing a silicon material by using a polishing composition containing abrasive grains, a tri - or more polyvalent hydroxy compound, and a dispersing medium and having pH of less than 6.0,
    wherein the abrasive grains are cation-modified colloidal silica, and
    wherein the polishing composition does not comprise an oxidizing agent.

2. The polishing method according to claim 1, wherein the tri- or more polyvalent hydroxy compound has a molecular weight of 90 or more.

3. The polishing method according to claim 1, wherein the tri- or more polyvalent hydroxy compound is a sugar alcohol.

4. The polishing method according to claim 1, wherein the pH is 2.0 or more and 5.5 or less.

5. The polishing method according to claim 1, wherein the silicon material has an oxygen atom and a silicon atom.

6. The polishing method of claim 1, wherein the tri- or more polyvalent hydroxy compound is at least one selected from the group consisting of (2R,3R,4S)-pentane-1,2,3,4,5-pentole, (2R,3R,4S,5S)-hexane-1,2,3,4,5,6-hexol, and xylitol.

7. The polishing composition according to claim 1, wherein the polishing composition does not comprise anion-modified colloidal silica.

8. A polishing method, comprising polishing a polishing object containing a silicon material by using a polishing composition consisting of abrasive grains, a tri - or more polyvalent hydroxy compound, a pH adjusting agent, and a dispersing medium and having pH of less than 6.0,
    wherein the abrasive grains are cation-modified colloidal silica,
    wherein the polishing composition does not comprise an oxidizing agent.

9. The polishing method according to claim 8, wherein the tri - or more polyvalent hydroxy compound has a molecular weight of 90 or more.

10. The polishing method according to claim 8, wherein the tri - or more polyvalent hydroxy compound is a sugar alcohol.

11. The polishing method according to claim 8, wherein the pH is 2.0 or more and 5.5 or less.

12. The polishing method according to claim 8, wherein the silicon material has an oxygen atom and a silicon atom.

13. The method of claim 8, wherein the polishing composition does not comprise anion-modified colloidal silica.

14. A polishing method, comprising polishing a polishing object containing a silicon material by using a polishing composition consisting of abrasive grains, a tri - or more polyvalent hydroxy compound, a pH adjusting agent, an additive, and a dispersing medium and having pH of less than 6.0,
    wherein the abrasive grains are cation-modified colloidal silica, and
    the additive is at least one selected from the group consisting of antiseptic agents, antifungal agents, and water-soluble polymers.

15. The polishing method according to claim 14, wherein the tri - or more polyvalent hydroxy compound has a molecular weight of 90 or more.

16. The polishing method according to claim 14, wherein the tri - or more polyvalent hydroxy compound is a sugar alcohol.

17. The polishing method according to claim 14, wherein the pH is 2.0 or more and 5.5 or less.

18. The polishing method according to claim 14, wherein the silicon material has an oxygen atom and a silicon atom.

* * * * *